United States Patent [19]
Makinouchi

[11] Patent Number: 5,446,519
[45] Date of Patent: Aug. 29, 1995

[54] STAGE DEVICE
[75] Inventor: Susumu Makinouchi, Zama, Japan
[73] Assignee: Nikon Corporation, Tokyo, Japan
[21] Appl. No.: 186,555
[22] Filed: Jan. 26, 1994
[30] Foreign Application Priority Data
  Feb. 1, 1993 [JP] Japan .................................. 5-014419
[51] Int. Cl.6 .............................................. G03B 27/42
[52] U.S. Cl. .................................... 355/53; 318/649
[58] Field of Search ............................ 355/53; 318/649
[56] References Cited
U.S. PATENT DOCUMENTS
  4,525,659 6/1985 Imahashi et al. ..................... 318/649

Primary Examiner—Richard A. Wintercorn
Attorney, Agent, or Firm—Shapiro and Shapiro

[57] ABSTRACT

A stage device is provided with a base plate supported by an antivibration device; a table supported by the base plate through a driving shaft in substantially rigid manner; and a first drive system for placing the table in a predetermined position on the base plate. A second drive systems is provided for applying, to the table, an acceleration the same as that of the base plate, in order to correct the relative positional aberration between the base plate and the table, induced by the vibration of the base plate generated when the table is driven by the first drive system.

20 Claims, 2 Drawing Sheets

STAGE DEVICE

BACKGROUND OF THE INVENTION

1. Field of the Invention

The present invention relates to a stage device, and more particularly to a stage device adapted for use in an exposure apparatus for manufacturing a semiconductor device, a substrate for a liquid crystal display device, a thin film magnetic head or the like.

2. Related Background Art

In a lithographic process for producing a semiconductor device, substrate for a liquid crystal display device or the like, there is employed a projection exposure apparatus for exposing a photosensitive substrate to the image of a pattern of a photomask or a reticle (hereinafter collectively called reticle) through a projection optical system. Such apparatus is usually provided with a stage device capable of supporting the photosensitive substrate (wafer) and of two-dimensional movement, and the exposure is executed by aligning the reticle and the wafer, through positioning of the stage device to a predetermined position.

Such projection exposure apparatus is placed on an antivibration table, in order to prevent undesirable effect for example on the precision of alignment between the reticle and the wafer, resulting from the vibration of the ground (exterior of the apparatus). Such antivibration table attenuates the vibration from the exterior of the apparatus, by means of an elastic member or a damping member.

FIG. 4 is a schematic view of a conventional projection exposure apparatus.

In the stage device employed in the conventional projection exposure apparatus for semiconductor device production, as shown in FIG. 4, a stage control unit (not shown) drives a motor 4Y provided on an antivibration table 12 constituting a base plate, thereby driving a table 1 to a predetermined position through a feed screw (driving shaft) 3Y. The table 1 supports thereon a wafer W constituting the photosensitive substrate. Onto a desired exposure area on the wafer, light emitted from a light source 20 and directed onto a reticle 18 through an illumination optical system 19, consisting of lens systems such as a fly's eye lens, a condenser lens etc., is projected onto a wafer N by a projection lens 17, whereby a mask pattern is imaged on the wafer. After a projection exposure to the exposure area, the table 1 is suitably moved in such a manner that a next exposure area is positioned in a predetermined position within the projection field of the projection lens 17. An interferometer 7Y measures the position of the table 1, based on the reflected light from a mirror 8Y provided on the table 1.

In such stage device of the conventional configuration, the entire device excluding the table 1 is fixed, as a rigid member, on the antivibration table 12, and the table 1 is fixed, by means of the feed screw 3Y and a guide mechanism (not shown) of the table 1, as a substantially rigid member, to the main body of the device. Stated differently, the table 1 and the device are macroscopically integral, but, in consideration of the comparison of the rigidity of the entire device and the supporting rigidity of the table 1, they are microscopically equivalent to a structural model in which the table is elastically supported on the base plate. This is because, in the requested precision, the feed screw 3Y cannot be regarded as a completely rigid body due to the play and friction in the junction. Because of this fact, the driving (including deceleration and stopping) of the table 1 generates vibration in the entire device excluding the table 1. More specifically, the reaction force of the driving force acting on the table 1 acts on the antivibration table, thereby generating vibration in the entire device excluding the table 1.

However, the table 1 alone tends to remain in the original position by inertia, so that so-called vibration-induced positional aberration is generated between the entire device and the table 1, or between the antivibration table 12 constituting the base plate and the table 1.

In such conventional stage device employed in the projection exposure apparatus for producing semiconductor devices, in driving the table for movement to a predetermined position, there is generated vibration in the entire device, and a positional aberration is generated, resulting from said vibration, between the antivibration table and the table. Since the optical system for projection exposure and the reticle 18 are fixed as rigid members to the base plate as explained before, the positional aberration between the reticle 18 (or the projection optical system 17) and the wafer placed on the table 1 detrimentally affects the performance of the exposure apparatus. For this reason the projection exposure has to be executed after the vibration becomes sufficiently small by spontaneous attenuation, so that the throughput is significantly lowered.

SUMMARY OF THE INVENTION

The present invention, attained in consideration of the foregoing, is intended to provide a stage device not inducing the positional aberration between the table and the base plate even if vibration is generated by the driving of the table, and thus capable of improving the throughput.

The above-mentioned object can be attained, according to the present invention, by a stage device comprising a base plate supported by an antivibration device, a table supported slidably by said base plate, a driving shaft connected to said table and adapted to cause a sliding motion of said table, first drive means for driving said table through said driving shaft for placing said table on a predetermined position on said base plate, and second drive means.

Said second drive means is adapted to provide said table with a force in such a manner as to correct the relative positional aberration between said base plate and said table, resulting from the vibration of said base plate induced by the reaction force of the driving for said table.

In a preferred embodiment of the present invention, the second drive means is composed of a linear motor mechanism provided between the base plate and the table. More preferably there is further comprised acceleration measuring means for measuring the acceleration of the base plate, or acceleration calculating means for numerically calculating the acceleration of the base plate, based on the given acceleration of the table, or acceleration measuring means for measuring the acceleration of the table and acceleration calculating means for numerically calculating the acceleration of the base plate based on the measured acceleration of the table.

The present inventor has observed the positional aberration between the antivibration table and the driven table resulting from the vibration, induced by the reaction force of the driving of the table, and has achieved the present invention for correcting and resolving said positional aberration, by causing the driven table to follow the vibrating motion of the base plate, namely providing the driven table with an acceleration the same as that of the base plate on real-time basis.

More specifically, according to the present invention, by providing the driven table with a force F(t) given by the following equation on real-time basis:

$$F(t) = m \times a(t)$$

wherein a(t) is the acceleration of the base plate at a time t during the table movement, and m is the mass of the table, the relative speed between the base plate and the table becomes zero at the end of the table movement, and said positional aberration resulting from the vibration can be resolved.

The acceleration a(t) of the base plate can be easily measured, for example by an acceleration sensor mounted thereon. Consequently, the force F(t), obtained by multiplying the acceleration a(t) of the base plate measured on real-time basis with the already known mass of the table, is applied to the table by suitable means such as a linear motor mounted between the table and the base plate, thereby forcedly providing the table with an acceleration the same as that a(t) of the base plate and causing the table to completely follow the vibration of the base plate.

In a DC linear motor, the generated propulsion force $F_L$ is represented by the product of a constant k specific to the linear motor and the current i, namely $F_L = k \times i$. Therefore, a desired propulsive force can be easily applied to the table, by suitable control of the current i.

DETAILED DESCRIPTION OF THE PREFERRED EMBODIMENTS

Now the present invention will be clarified in detail by preferred embodiments, shown in the attached drawings.

Figure 1:
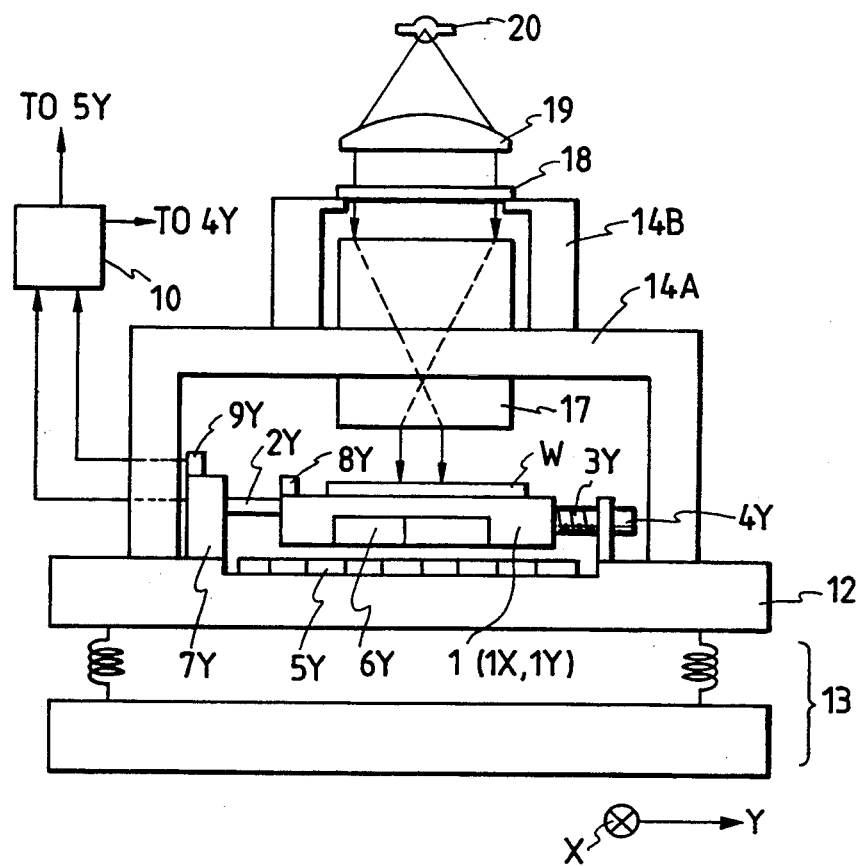
FIG. 1 is a schematic view of a projection exposure apparatus in which the stage device embodying the present invention is applicable.

FIG. 1 is a schematic view showing the structure of a projection exposure apparatus in which the stage device embodying the present invention can be applied.

Figure 4:
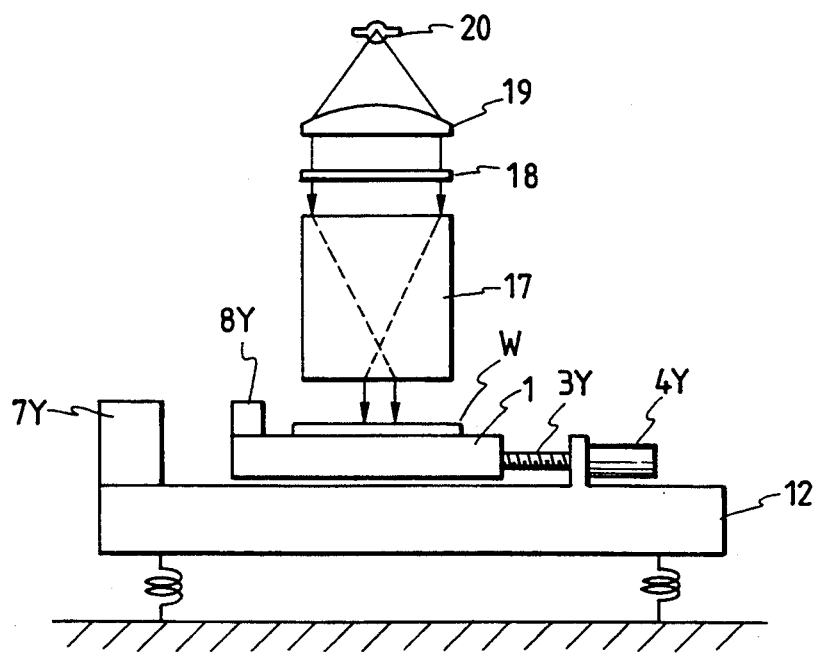
FIG. 4 is a schematic view of a conventional stage device employed in the projection exposure apparatus for semiconductor device manufacture.

The structure of the illustrated apparatus is similar to that of the conventional apparatus shown in FIG. 4. For this reason, components corresponding to those shown in FIG. 4 are represented by same reference numbers. The illustrated apparatus is different from the conventional apparatus principally in that a linear motor mechanism is provided between the table 1 and the antivibration table 12 as second drive means for the table 1, and that an acceleration meter is provided on the antivibration table 12 for measuring the acceleration thereof, and, because of these differences, the control system is made different.

An antivibration device 13 is provided to attenuate the vibration from the exterior of the apparatus. A support member 14A is fixed to the antivibration table 12 and supports the projection optical system 17, while a support member 14B is fixed to the support member 14A and supports the reticle 18.

Figure 2:
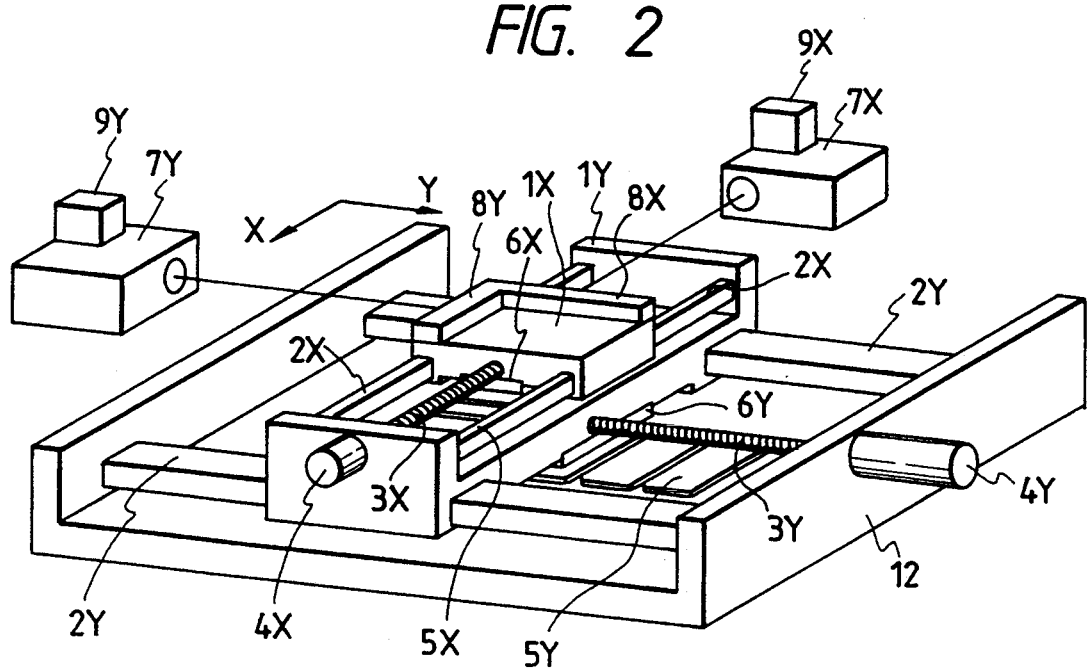
FIG. 2 is a perspective view of a stage device embodying the present invention.

FIG. 2 is a perspective view of a stage device embodying the present invention. The illustrated device is composed of a combination of a stage device movable in the X-direction and a stage device movable in the Y-direction, whereby the table 1 is arbitrarily movable in the horizontal plane.

The table 1 shown in FIG. 2 is composed of an X-table 1X movable in the X-direction and a Y-table 1Y movable in the Y-direction, wherein said X-table 1X is provided on the Y-table 1Y. The X-table 1X is supported by the Y-table 1Y by means of a non-contact guide mechanism (such as an air bearing) 2X extending in the X-direction, and the Y-table 1Y supporting the X-table 1X, supporting the X-table 1X, is provided on the antivibration table 12, and is supported thereby by means of a non-contact guide mechanism 2Y (such as an air bearing) extending in the Y-direction.

The Y-table 1Y is driven in the Y-direction by a feed screw 3Y, provided parallel to the guide mechanism 2Y and driven by a motor 4Y mounted on the antivibration table 12. Between the Y-table 1Y and the antivibration table 12 there is provided a linear motor mechanism 5Y, 6Y of which details will be given later. The X-table 1X is driven in the X-direction by a feed screw 3X, provided parallel to the guide mechanism 2X and driven by a motor 4X mounted on the Y-table 1Y. Between the X-table 1X and the Y-table 1Y there is provided a linear motor mechanism 5X, 6X of which details will be given later.

A laser interferometer 7Y measures the position of the Y-table 1Y in non-contact manner, based on the returning light from a mirror 8Y provided on the X-table 1X, and is capable of highly precise detection of the position of the Y-table 1Y. A laser interferometer 7X measures the position of the X-table 1X in non-contact manner, based on the returning light from a mirror 8X provided on the X-table 1X, and is capable of highly precise detection of the position of the X-table 1X. Although not illustrated in FIG. 2, the laser interferometer 7Y is fixed on the antivibration table 12, while the laser interferometer 7X is fixed on the Y-table 1Y. On the antivibration table 12, an acceleration meter 9Y is provided for measuring the acceleration of the antivibration table 12 in the Y-direction, while on the Y-table 1Y an acceleration meter 9X is provided for measuring the acceleration of the Y-table 1Y in the X-direction. The latter in fact measures the acceleration of the stage device excluding the X-table 1X, thereby measuring the acceleration of the antivibration table 12 in the X-direction. In the following text, the acceleration measured by the acceleration meter 9X will be represented as "acceleration of the Y-table 1Y in the X-direction".

Since the linear motor mechanism (5X, 6X) for driving the X-table 1X in the X-direction and the linear motor mechanism (5Y, 6Y) for driving the Y-table 1Y in the Y-direction are the same in the basic structure, in the following there will be only explained the former mechanism for driving the X-table 1X in the X-direction, with reference to FIG. 3.

Figure 3:
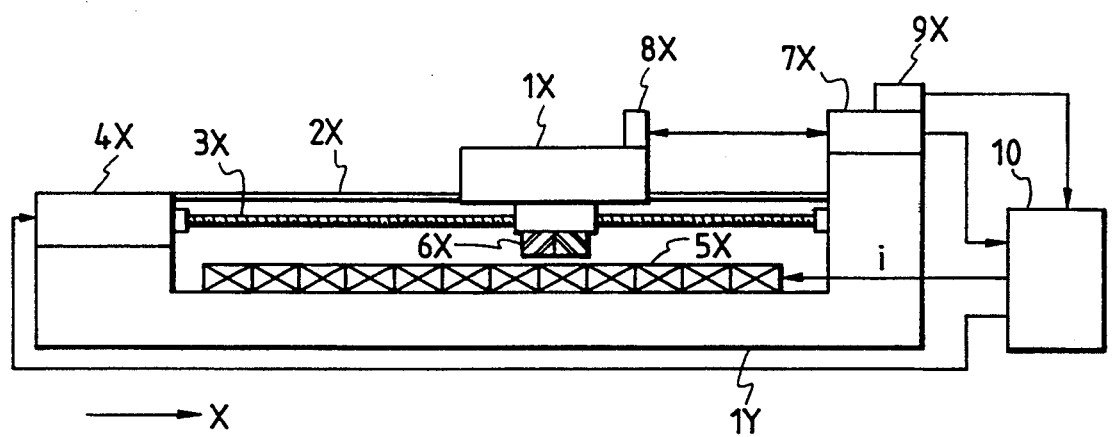
FIG. 3 is a schematic lateral view of said stage device embodying the present invention.

FIG. 3 is a schematic lateral view of the configuration of the stage device embodying the present invention.

Between the X-table 1X and the Y-table 1Y there is provided the linear motor mechanism (5X, 6X), composed of a stator 5X mounted on the Y-table 1Y and a movable member 6X mounted on a side, facing the Y-table 1Y, of the X-table 1X.

Also in the Y-direction, a linear motor mechanism (5Y, 6Y) is similarly provided between the Y-table 1Y and the antivibration table 12 (cf. FIG. 1).

The illustrated device is further provided with a controller 10, which receives the table position information measured by the laser interferometers 7X, 7Y in cooperation with the mirrors 8X, 8Y, and the acceleration information measured by the acceleration meters 9X, 9Y, and suitably drives the tables 1X, 1Y through the motors 4X, 4Y and the feed screws 3X, 3Y or through the linear motor mechanisms (5X, 6X), (5Y, 6Y). In addition, the controller 10 controls the entire device.

When the above-explained stage device of the present invention is employed in the projection exposure apparatus for semiconductor device production, the table 1 supporting the wafer constituting the photosensitive substrate is driven, after a projection exposure, in such a manner that a next exposure area is placed in a predetermined position within the projection field of the projection optical system. More specifically, the controller 10 receives the current position information and the target position information, and moves the tables 1X, 1Y rapidly to the target position by means of the motors 4X, 4Y and the feed screws 3X, 3Y. In this operation, each of the tables 1X, 1Y effects a motion under a positive acceleration, a constant-speed motion and a motion under a negative acceleration. In the following there will be explained the vibration and antivibration in the X-direction.

The table 1X is subjected to an acceleration by the motor 4X and the feed screw 3X, and a reaction force is applied to the Y-table 1Y on which said motor 4X and feed screw 3X are mounted. As a result, the entire device excluding the table 1X generates vibration. Since the table 1X is supported on the Y-table 1Y by the non-contact guide mechanism 2X and the feed screw 3X, the table 1X is subjected to inertia, thus tending to remain in the original position, independently from the vibration of the entire device.

This is because, though the table 1X generally moves integrally with the entire device through the guide mechanism 2X and the feed screw 3X, it does not completely follow the movement of the entire device as the feed screw 3X etc. are not completely rigid.

Consequently, according to the present invention, the controller 10 receives the acceleration information of the Y-table 1Y in the X-direction, measured by the acceleration meter 9X, and provides the table 1X a the real-time basis, with an acceleration same as said measured acceleration of the Y-table 1Y in the X-direction, through the linear motor mechanism 5X, 6X. As a result, during the movement of the X-table 1X, there is not generated the relative positional aberration between the X-table 1X and the Y-table 1Y resulting from the vibration. Thus, since the relative positional relationship is maintained between the reticle 18 and the wafer W, there can be executed the exposure operation without awaiting the attenuation of the vibration of the device. The acceleration meter 9X in this embodiment is provided on the Y-table 1Y, but it may naturally be provided also on the antivibration table 12.

As already explained in the foregoing, since the acceleration $a_1(t)$ of the X-table 1X is measured on real-time basis by the acceleration meter 9X on the base plate and since the mass $m_1$ of the X-table 1X is already known, the X-table 1X is subjected to an acceleration the same as that of the Y-table 1Y on real-time basis by the application of a force $F(t) = m_1 \times a_1(t)$. As a result, it is rendered possible to cause the X-table 1X to completely follow the vibration of the Y-table 1Y and thus to completely eliminate the aforementioned relative positional aberration. The current i supplied to the linear motor mechanism (5X, 6X) is suitably controlled by the controller 10 in such a manner that the propulsive force $F_t$ generated by the linear motor mechanism (5X, 6X) becomes always equal to the above-mentioned force $F(t)$.

Also in the Y-direction, the acceleration information of the antivibration table 12 is measured by the acceleration meter 9Y, and the controller 10 controls the linear motor mechanism (5Y, 6Y) in a similar manner as in the X-direction. However, since the Y-table 1Y moves integrally with the X-table 1X, the mass of the Y-table in this case is the sum of the mass $m_1$ of the X-table 1X and the mass $m_2$ of the Y-table 1Y. Consequently the force $F(t)$ to be applied to the Y-table 1Y is given by:

$$F(t) = (m_1 + m_2) \times a_2(t),$$

wherein $a_2(t)$ is the acceleration of the antivibration table 12.

In the foregoing embodiment, the acceleration of the antivibration table 12 is directly measured by the acceleration meter, and the table 1 is forcedly subjected to the force determined from thus actually measured acceleration. However, in consideration of the fact that the vibration of the antivibration table 12 is induced by the driving of the table 1, the acceleration of the antivibration table 12 can also be obtained by numerical calculation, even without relying on the acceleration meter, namely without direct measurement of the acceleration of the antivibration table 12. Consequently the force to be applied to the table 1 can also be determined by calculation.

With respect to the motion in the X-direction, the equation of motion of the vibrating antivibration table 12, or the entire device excluding the X-table 1X, can be represented as follows:

$$Fs(t) = M \cdot x''(t) + B \cdot x'(t) + K \cdot x(t)$$

wherein
Fs: vibration inducing force applied to the antivibration table 12. Since this force is the reaction force of the driving force applied to the X-table 1X, $Fs(t) = -m_1 \times a_1(t)$;
M: mass of the entire device excluding the X-table 1X;
$x''$: acceleration of the antivibration table;
B: viscous resistance coefficient;
K: spring constant.

The mass M of the entire device excluding the table 1X, the viscous resistance coefficient B, the spring constant K and the mass $m_1$ of the table are already known. Also the acceleration $a_1(t)$ of the table 1X is either already known as a design parameter, or can be determined in the controller 10 from the position information of the table measured by the aforementioned laser interferometer 7X. Thus it is possible to determine the force $Fs(t) = -m_1 \times a_1(t)$. Also the spring constant K and the viscous resistance coefficient B are parameters inherent to the antivibration pads supporting the antivibration table 12 on the floor.

Thus the equation of motion of the antivibration table 12 can be solved by a numerical calculation in a computer (controller 10), and the acceleration $x''(t)$ of the antivibration table can be calculated. The operations of applying a predetermined force to the X-table 1X utilizing the calculated acceleration $x''(t)$ of the antivibration table thereby completely eliminating the aforementioned relative positional aberration are as already explained before. Also for the motion in the Y-direction, the force to be applied to the Y-table 1Y can be determined by calculation.

Also, if the acceleration $a_1(t)$ of the table 1X is not known, the present invention may utilize a speedometer instead of the laser interferometer. Thus the controller 10 can determined the acceleration $a_1(t)$ from the output of such speedometer.

In the present embodiment, a linear motor mechanism is employed for correcting the positional aberration between the table 1 and the antivibration table, induced by vibration, but it may also be utilized as vernier means for moving the table 1 by a small amount when the stopped position of the table 1 does not match the target position, or as deceleration means (damper) for accelerating the attenuation of the vibration.

The present embodiment is a stage device adapted for use in a projection exposure apparatus for semiconductor device production, but the present invention is naturally applicable also to other general stage devices, within the scope thereof.

What is claimed is:

1. A stage device comprising:
   (a) a base plate supported by an antivibration device;
   (b) a table movably supported by said base plate;
   (c) a first driving system for moving said table, the movement of said table causing a vibration of said base plate; and
   (d) a second driving system which can apply force to said table in a direction parallel to the moving direction of said table to thereby correct an aberration in the relative position of said base plate and said table, induced by said vibration of said base plate.

2. A stage device according to claim 1, wherein the force applied by said second driving system to said table is determined according to an acceleration of said base plate when the base plate vibrates by the movement of said table.

3. A stage device according to claim 1, wherein said second driving system is a linear motor mechanism.

4. A stage device according to claim 1, further comprising an acceleration measuring device for measuring an acceleration of said base plate.

5. A stage device according to claim 1, further comprising a calculator for calculating an acceleration of said base plate based on an acceleration given to said table.

6. A stage device according to claim 1, further comprising an acceleration measuring device for measuring an acceleration of said table and a calculator for calculating an acceleration of said base plate based on the acceleration of said table.

7. An exposure apparatus comprising:
   (a) a support member for supporting a mask;
   (b) a base plate for supporting said support member;
   (c) an antivibration device for supporting said base plate;
   (d) a table, movably supported by said base plate, for mounting a photosensitive substrate;
   (e) a first driving system for moving said table, the movement of said table causing vibration of said base plate; and
   (f) a second driving system which can apply force to said table in a direction parallel to the moving direction of said table to thereby correct an aberration in the relative position of said base plate and said table, induced by said vibration of said base plate.

8. An exposure apparatus according to claim 7, wherein the force applied by said second driving system to said table is determined according to an acceleration of said base plate when the base plate vibrates by the movement of said table.

9. An exposure apparatus according to claim 7, wherein said second driving system is a linear motor mechanism.

10. An exposure apparatus according to claim 7, further comprising an acceleration measuring device for measuring acceleration of said base plate.

11. An exposure apparatus according to claim 7 further comprising a calculator for calculating an acceleration of said base plate based on an acceleration given to said table.

12. An exposure apparatus according to claim 7, further comprising an acceleration measuring device for measuring an acceleration of said table and a calculator for calculating an acceleration of said base plate based on the acceleration of said table.

13. A stage device comprising:
   (a) a base plate;
   (b) a table supported by said base plate;
   (c) a first driving system for moving said table;
   (d) a detector for detecting a vibration of said base plate caused by the movement of said table; and
   (e) a second driving system for applying force to said table based on an output of said detector to thereby correct an aberration in the relative position of said base plate and said table, induced by said vibration of said base plate.

14. A stage device according to claim 13, wherein said detector includes an acceleration measuring device for measuring an acceleration of said base plate.

15. A stage device according to claim 13, wherein said detector includes a calculator for calculating an acceleration of said base plate based on an acceleration given to said table.

16. A stage device according to claim 13, wherein said detector includes an acceleration measuring device for measuring an acceleration of said table and a calculator for calculating an acceleration of said base plate based on the acceleration of said table.

17. An exposure apparatus comprising:
   (a) a base plate;
   (b) a table, movably supported by said base plate, for mounting a photosensitive substrate;
   (c) a first driving system for moving said table;
   (d) a detector for detecting vibration of said base plate caused by the movement of said table; and
   (e) a second driving system for applying force to said table based on an output of said detector to thereby correct an aberration in the relative position of said base plate and said table, induced by said vibration of said base plate.

18. An exposure apparatus according to claim 17, wherein said detector includes an acceleration measuring device for measuring an acceleration of said base plate.

19. An exposure apparatus according to claim 17, wherein said detector includes a calculator for calculating an acceleration of said base plate based on an acceleration given to said table.

20. An exposure apparatus according to claim 17, wherein said detector includes an acceleration measuring device for measuring an acceleration of said table and a calculator for calculating an acceleration of said base plate based on the acceleration of said table.

* * * * *